United States Patent
Miyamoto et al.

(10) Patent No.: US 7,276,125 B2
(45) Date of Patent: Oct. 2, 2007

(54) BARREL TYPE SUSCEPTOR

(75) Inventors: Toshikazu Miyamoto, Yamaguchi (JP); Tadashi Ohashi, Yamaguchi (JP)

(73) Assignees: Toshiba Ceramics Co., Ltd., Tokyo (JP); Tokuyama Toshiba Ceramics Co., Ltd., Shunan-shi (JP)

( * ) Notice: Subject to any disclaimer, the term of this patent is extended or adjusted under 35 U.S.C. 154(b) by 314 days.

(21) Appl. No.: 11/017,711

(22) Filed: Dec. 22, 2004

(65) Prior Publication Data
US 2005/0160991 A1    Jul. 28, 2005

(30) Foreign Application Priority Data
Dec. 22, 2003   (JP)   ............... 2003-425596

(51) Int. Cl.
 C23C 16/00   (2006.01)
 C23C 14/00   (2006.01)
 H01L 21/00   (2006.01)

(52) U.S. Cl. .............. 118/725; 118/728; 118/729; 118/730; 156/345.51; 156/345.54; 156/345.55; 219/444.1; 219/544

(58) Field of Classification Search ........ 118/715–733; 156/345.51, 345.54, 345.55; 219/444.1, 219/544
See application file for complete search history.

(56) References Cited

FOREIGN PATENT DOCUMENTS

| JP | 01208469 A | * | 8/1989 |
| JP | 02212393 A | * | 8/1990 |
| JP | 3-30269 U |   | 3/1991 |
| JP | 6-151339 A |   | 5/1994 |
| JP | 06151339 A | * | 5/1994 |

OTHER PUBLICATIONS

Merriam Webster's Collegiate Dictionary, 10th ed. (1994).*

* cited by examiner

Primary Examiner—Ram Kackar
Assistant Examiner—Matthew Eggerding
(74) Attorney, Agent, or Firm—Foley & Lardner LLP

(57) ABSTRACT

The barrel type susceptor for use in the semiconductor epitaxial growth is characterized in that a face plate 5 of a susceptor main body 2 having the shape of a truncated cone is partitioned into two or more in a longitudinal direction thereof, each partition being provided with a wafer mounting concave portion 6a, 6b, 6c on which a wafer is laid, and the inclination angle θa, θb, θc of a bottom face $6a_1$, $6b_1$, $6c_1$ of the concave portion for each partition to the vertical line is gradually decreased in each partition from the upper part to the lower part.

9 Claims, 5 Drawing Sheets

BARREL TYPE SUSCEPTOR

The present invention claims foreign priority to Japanese patent application no. 2003-425596, filed on Dec. 22, 2003, the contents of which is incorporated herein by reference.

BACKGROUND OF THE PRESENT INVENTION

1. Field of the Present Invention

The present invention relates to a barrel type susceptor for use in an epitaxial growth, and more particularly to a barrel type susceptor in which inclination angles of a bottom surface of a wafer mounting concave portion is changed with positions in a height direction.

2. Description of the Related Art

Generally, an epitaxial apparatus is used for manufacturing an epitaxial wafer. As the epitaxial apparatus, a barrel type susceptor is mostly employed.

A conventional barrel type susceptor 61 has a susceptor main body 62 having a shape of a hollow polygonal truncated cone (e.g., pentagonal, hexagonal, heptagonal and tetragonal truncated cone), a polygonal top plate 63 provided on a top of the susceptor main body 62 so as to suspend the susceptor main body 62, and an polygonal bottom plate 64 provided on the bottom to shield a gas flow, as shown in FIG. 8.

The susceptor main body 62 is made of a carbon member coated with SiC, and cut out of special carbon structural material, or formed in its configuration by integrally attaching eight high trapezoidal face plates to a top plate and a bottom plate. On each planar face plates 65 of the susceptor main body 62, a plurality of wafer mounting concave portions 66a for mounting a semiconductor wafer W are aligned in a longitudinal direction. Also, a bottom face 66a_1 of the wafer mounting concave portion 66a is provided at a constant inclination angle θd of 0° to 5° to the vertical axis.

When an epitaxial wafer is produced, employing this conventional barrel type susceptor and an epitaxial apparatus 70 as shown in FIG. 9, a wafer Wa on the uppermost stage of the susceptor and a wafer Wc on the lowermost stage have a greater film thickness, and a wafer Wb on the middle stage has a smaller film thickness. Accordingly, a uniform film thickness distribution was not obtained within the wafer and batch. The film thickness distribution is controlled by changing a temperature distribution in the epitaxial growth. However, even though the uniform film thickness is obtained by changing the temperature distribution, at the same time, the uniformity of the resistivity is made worse. Therefore, the temperature distribution cannot be changed.

Moreover, as a method for improving the uniformity of the film thickness distribution while keeping the temperature distribution uniform from the uppermost stage of the susceptor to the lowermost stage, there is a method of changing a flow rate of a source gas. This is the method in which the flow rate near a gas introduction portion is changed by shifting a position of a gas introduction nozzle upwardly or downwardly. However, this method can apply in a case that the thickness on the uppermost stage or the lowermost stage is thick. In this case, the uniformity of the film thickness distribution is improved. The film thickness distribution obtained by this method is shown in FIG. 7, in which there is a limited dispersion with the conventional barrel type susceptor. When adopting this method, for producing high quality productions, a method for decreasing the dispersion within the batch by reducing the number of stages for mounting the wafer is adopted. Accordingly, productivity is lower in the conventional method.

Referring to Japanese Patent Unexamined Publication no. JP-A-6-151339, paragraphs 0014, 0015 and 0018, and FIG. 1, a barrel type susceptor has been proposed which has the susceptor main body and removable wafer arranging parts. In the proposed susceptor, the angle of a reaction gas acting on the wafer is changed in accordance with the wafer arranging parts having appropriately different shapes at the time of an epitaxial growth process or every time of the process to improve the crystalline of the epitaxial layer and the uniformity of film thickness. However, in the proposed susceptor, since the wafer arranging parts are changed at the time of the epitaxial growth process or every time of the process, it takes a lot of time to change the parts and the mounting of wafers, resulting in lower productivity.

SUMMARY OF THE PRESENT INVENTION

This invention has been achieved in the light of the above-mentioned problems, and it is an object of the present invention to provide a barrel type susceptor in which the film thickness is more uniform within the wafer and batch and the productivity is increased without reducing the number of stages for mounting the wafer and without needing to change the mounting of wafers at the time of an epitaxial growth process or every time of the process, even when the high quality articles are produced.

In order to achieve the above mentioned object, according to a first aspect of the present invention, there is provided a barrel type susceptor used in a semiconductor epitaxial growth, the susceptor being a substantially truncated petrosal shape, the susceptor comprising:

a top plate;

a bottom plate, an area of the bottom plate being larger than an area of the top plate; and a side plate which connects the top plate to the bottom plate, wherein the side plate is partitioned into at least two partitions in a vertical direction of the susceptor, a concaved portion on which a wafer is mounted is provided on each partition of the side plate, inclined angles defined between each partition of the side plate and a vertical section which passes through a center of an edge in the bottom surface are decreased gradually from a top plate side to a bottom plate side, and angles defined between each bottom surface of the concaved portions and the vertical section are decreased gradually from the top plate side to the bottom plate side.

According to a second aspect of the present invention as set forth in the first aspect of the present invention, it is preferable that the susceptor is hollow and a substantially truncated polygonal petrosal shape, and the susceptor is formed by cutting out of a single material.

According to a third aspect of the present invention as set forth in the first aspect of the present invention, it is more preferable that the susceptor is hollow and substantially truncated cone shape, and the susceptor is formed by cutting out of a single material.

According to a fourth aspect of the present invention as set forth in the first aspect of the present invention, it is further preferable that the susceptor is hollow and a substantially truncated polygonal petrosal shape, and the concaved portion of the susceptor is formed by combining flat plates.

According to a fifth aspect of the present invention as set forth in the first aspect of the present invention, it is preferable that the side plate is partitioned into three partitions which are an upper side partition having a first inclined angle θa, an intermediate partition having a second inclined angle θb and a lower side partition having a third inclined angle θc, the inclined angles θa, θb and θc satisfy below relations:

$0 < \theta b \leq 5°$;

$\theta b < \theta a < \theta b + 5°$; and $0 \leq \theta c < \theta b$.

In the barrel type susceptor according to the present invention, the film thickness is more uniform within the wafer and batch and the productivity is increased without reducing the number of stages for mounting the wafer and without needing to change the mounting of wafers at the time of the epitaxial growth process or every time of the process, even when the high quality articles are produced.

DETAILED DESCRIPTION OF THE PREFERRED EMBODIMENTS

A first embodiment of a barrel type susceptor according to the present invention will be described below with reference to the accompanying drawings.

Figure 1:
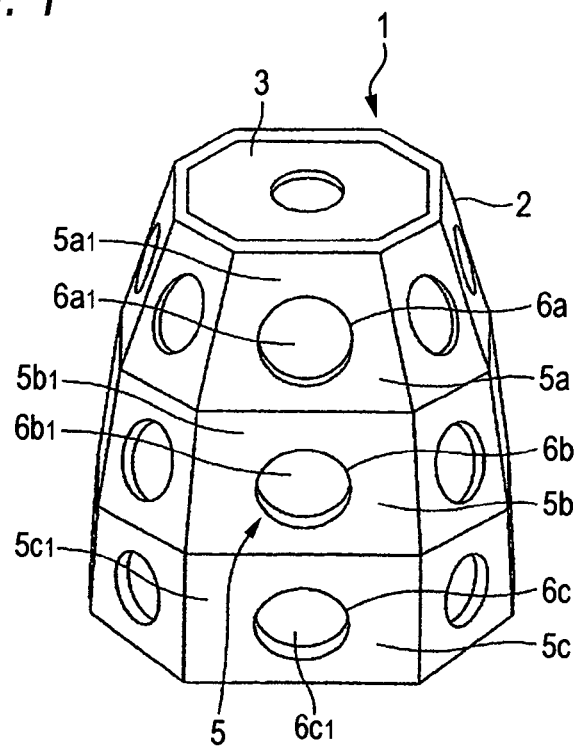
FIG. 1 is a perspective view of a barrel type susceptor according to one embodiment of the present invention.
Figure 2:
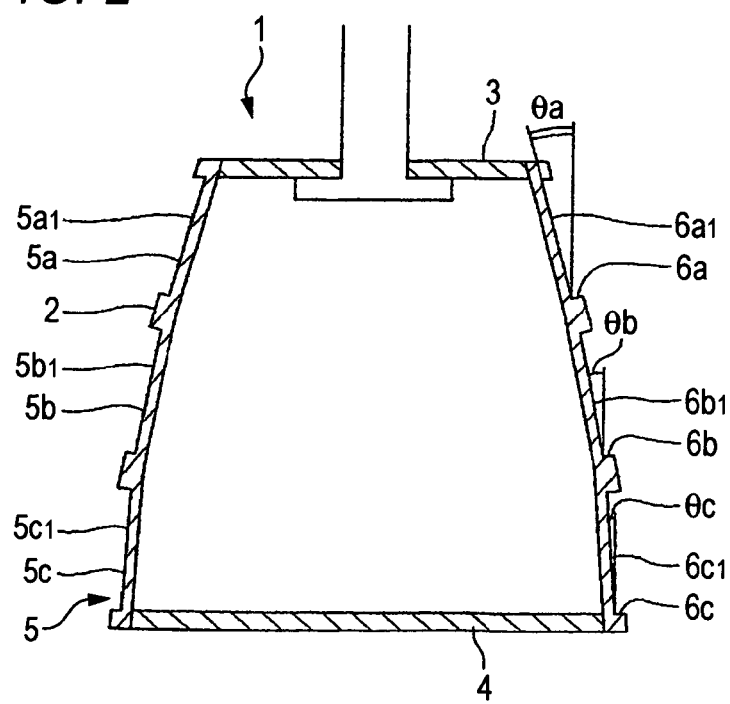
FIG. 2 is a longitudinal cross-sectional view of the barrel type susceptor according to the embodiment of the present invention.

FIG. 1 is a perspective view of the barrel type susceptor according to the present invention, and FIG. 2 is a longitudinal cross-sectional view of the barrel type susceptor.

The barrel type susceptor 1 of the present invention is employed in the semiconductor epitaxial growth, and has a susceptor main body 2 having a shape of a hollow truncated octagonal cone, and formed with a plurality of stages slightly inclined on the truncated octagonal cone, an octagonal top plate 3 provided on the top of the susceptor main body 2 so as to suspend the susceptor main body 2, and an octagonal bottom plate 4 having an octagonal shape larger than the top plate 3 and provided on the bottom to shield a gas flow, as shown in FIGS. 1 and 2.

The susceptor main body 2 is cut out of special carbon structural material into a hollow truncated octagonal conical shape and formed with a SiC film on its surface. Eight planar face plates 5 formed along a circumferential direction of the susceptor main body 2 having the shape of a truncated octagonal cone are partitioned into two or more portions, for example, three portions of an upper stage 5a, a middle stage 5b and a lower stage 5c having a different inclination angle, in its longitudinal direction. FIG. 2 shows how each partitioned portion of a planar face plate forms an inclined angle with a vertical plane passing through the susceptor and perpendicular to the top and bottom plates, wherein said angles are decreased gradually from the top plate to the bottom plate. A wafer mounting concave portion is provided on a face plate $5a_1$ of the upper stage 5a, and inclined so that the inclination angle with a concave portion bottom face of the wafer mounting concave portion may be θa. A wafer mounting concave portion is provided on a face plate $5b_1$ of the middle stage 5b, and inclined so that the inclination angle made with a concave portion bottom face of the wafer mounting concave portion may be θb smaller than θa. A wafer mounting concave portion is provided on a face plate $5c_1$ of the lower stage 5c, and inclined so that the inclination angle made with a concave portion bottom face of the wafer mounting concave portion may be θc which is smaller than θb. Three kinds of inclination angles are formed on the concave portion bottom face, in which the inclination angle is gradually decreased on each stage from a top side to a bottom side. FIG. 2 shows how each bottom face of each wafer mounting concaved portion also forms an angle with the vertical plane, wherein the angles of the bottom faces are decreased gradually from the top plate to the bottom plate.

On each stage 5a, 5b and 5c, one wafer mounting concave portion 6a, 6b and 6c on which the wafer is laid is provided.

When the barrel type susceptor 1 is employed, it is preferable that the inclination angle θb is $0° < \theta b \leq 5°$, the inclination angle θa is $\theta b < \theta a < \theta b + 5°$, and the inclination angle θc is $0° \leq \theta c < \theta b$, so that the distance between the middle stage 5b and chamber may be partially narrower. When the number of stages provided on the face plate is three, four or five, three or more kinds of inclination angle exist.

Figure 3:
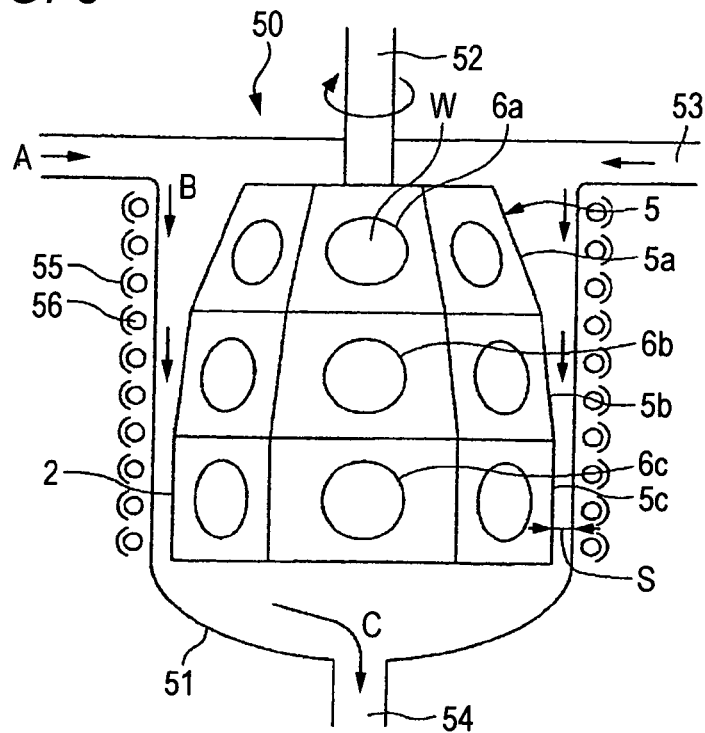
FIG. 3 is a conceptual view of an epitaxial apparatus employing the barrel type susceptor according to the embodiment of the present invention.

To produce an epitaxial wafer employing the barrel type susceptor as described above, an epitaxial apparatus 50 is used as shown in FIG. 3.

This epitaxial apparatus 50 has the barrel type susceptor 1, provided with the wafer mounting concave portions 6a, 6b and 6c on which a plurality of wafers W are laid, in which the barrel type susceptor is supported rotatably around a rotation axis 52 within a quartz verger 51. The quartz verger 51 has a gas inlet 53 for introducing an epitaxial gas at an upper portion and a gas outlet 54 for exhausting the gas at a lower portion. The epitaxial gas introduced through the gas inlet 53 is employed for epitaxial growth of wafer W, and exhausted from the gas outlet 54. Flows of source gas such as $SiCl_4$, carrier gas such as $H_2$ and dopant gas such as pH3 are indicated by arrows A, B and C.

An infrared radiation heater 56 having a resistive radiation heater or a reflecting mirror 55 is disposed around the quartz verger 51. In an epitaxial growth process using this epitaxial apparatus 50, the flow of an epitaxial gas is indicated by the arrow B which flows between the quartz verger 51 and the susceptor main body 2 being rotated around the rotation axis 52 within the quartz verger 51. Eight planar face plates 5 of the susceptor main body 2 are formed with three inclination angles on the upper stage 5a, the middle stage 5b and the lower stage 5c, so that the inclination angle is gradually decreased on each stage from the top side to the bottom side. Since, the distance between the middle stage 5b of the barrel type susceptor 1 and the quartz verger 51 is partially narrower, and the sectional area S of a gap between the barrel type susceptor 1 and the quartz verger 51 is made smaller, flow rate in this portion becomes faster. Accordingly, the uniform film thickness portion is obtained without making worse the uniformity of the resistivity.

Also, even when the high quality articles are produced, the epitaxial wafer can be manufactured without reducing the number of stages for mounting the wafer. Moreover, at the time of epitaxial growth process, or every time of the process, since it is not required to change the mounting of wafers, the productivity can be improved. Furthermore, because three kinds of inclination angle are formed on the bottom face of the wafer mounting concave portion in such a manner that the inclination angle is gradually decreased on each stage from the top to the bottom, the more uniform film thickness is obtained.

A second embodiment of the barrel type susceptor according to the present invention will be described below.

In the first embodiment, the susceptor main body has the shape of a hollow truncated octagonal cone, and eight planar face plates forming the truncated octagonal cone are partitioned into three stages, the wafer mounting concave portions being provided on each stage. Contrary to the first embodiment of the present invention, in the second embodiment, the susceptor main body has a shape of a hollow truncated cone, the face plate being partitioned into three stages, and a plurality of wafer mounting concave portions aligned in circular arc rows on each stage.

Figure 4:
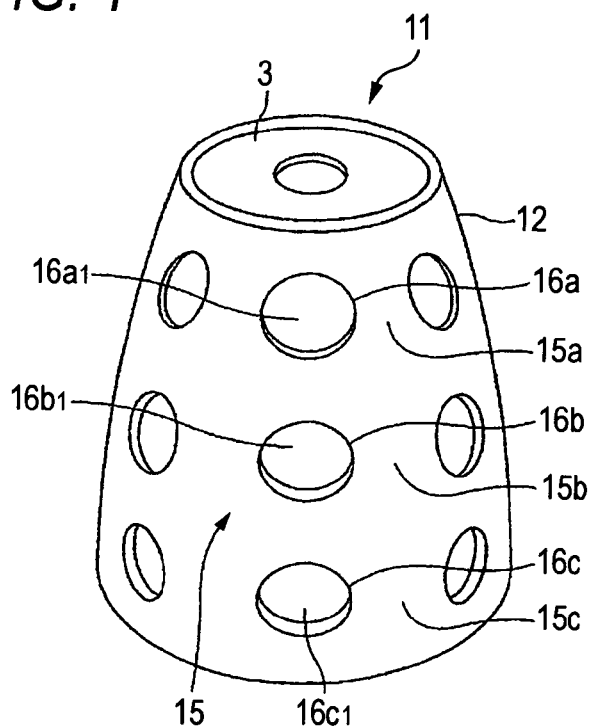
FIG. 4 is a perspective view of a barrel type susceptor according to another embodiment of the present invention.
Figure 5:
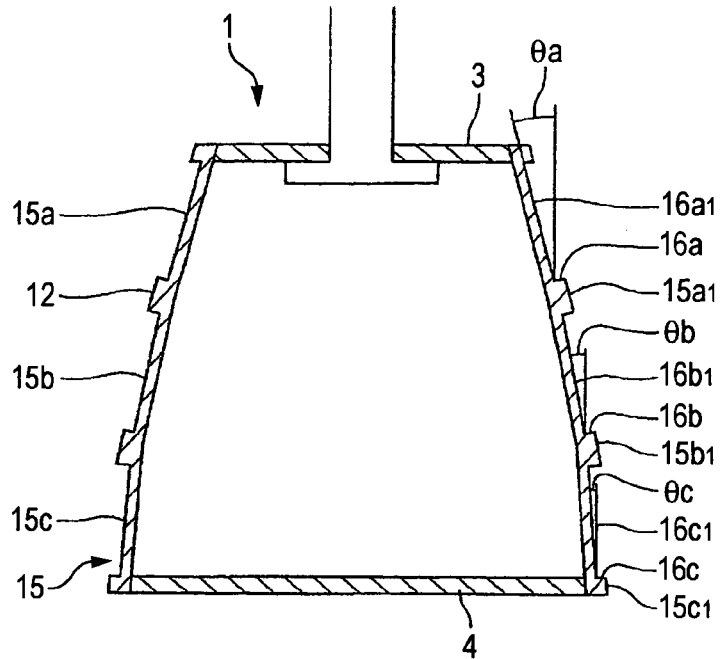
FIG. 5 is a longitudinal cross-sectional view of the barrel type susceptor as shown in FIG. 4.

For example, the barrel type susceptor 11 of the second embodiment comprises a susceptor main body having a hollow truncated conical shape close to a truncated hanging bell shape, a face plate 15 on its surface being formed of a series of circular arcs having different radiuses of curvature, and partitioned into three stages, including an upper stage 15a, a middle stage 15b and a lower stage 15c, as shown in FIGS. 4 and 5. Moreover, a mounting bottom face 15 is provided with one wafer mounting concave portion 16a, 16b, 16c for each row, plural rows of them being provided in a circumferential direction.

As in the first embodiment, a bottom face $6a_1$ of the wafer mounting concave portion 16a has an inclination angle θa made with the vertical axis, a bottom face $6b_1$ of the wafer mounting concave portion 16b has an inclination angle θb, and a bottom face $6c_1$ of the wafer mounting concave portion 16c has an inclination angle θc. Three kinds of inclination angle are formed on the bottom face of the wafer mounting concave portion, so that the inclination angle is gradually decreased on each stages from the top to bottom.

Accordingly, the susceptor main body 11 is formed of smooth continuous circular arcs without having any ridgeline in the circumferential direction, although eight planar face plates forming the truncated octagonal cone have the ridge line formed therebetween in the first embodiment. The other constitution is substantially the same as the barrel type susceptor as shown in FIG. 1. The same parts are designated by the same reference numbers and not described here.

According to the above described embodiments of the present invention, the sectional area of a gap between the barrel type susceptor and the quartz verger is partially made smaller, the flow rate in this portion becomes faster. Accordingly, the uniform film thickness portion is obtained without making worse the uniformity of the resistivity. Also, when the high quality articles are produced, the epitaxial wafer can be manufactured without reducing the number of stages for mounting the wafer. Moreover, at the time of the epitaxial growth process, or every time of the process, it is not required to change the position of the wafers, thereby improving the productivity.

Also, the epitaxial gas flowing along the susceptor main body is maintained in laminar flow without being disordered, whereby the more uniform film thickness portion is obtained.

EXAMPLES

Hereinafter, the present invention will be described with an example of the embodiment according to the present invention and a conventional example.

Object: The barrel type susceptor of the present invention as shown in FIG. 1 is incorporated into the epitaxial apparatus as shown in FIG. 3. Employing this apparatus, the epitaxial wafer was manufactured, and the film thickness was measured, and compared with the conventional example.

Method: The barrel type susceptor having the shape of a truncated octagonal cone, provided with the wafer mounting concave portions 6a, 6b and 6c having the inclination angles with the values as shown in Table 1 is contained within the cylindrical quartz verger 51, as shown in FIG. 3. This susceptor 1 is rotated around the longitudinal axis, and the wafer W is laid to the wafer mounting concave portions 6a, 6b and 6c formed on the face plate 5. The susceptor 1 and the wafer W are heated by an infrared radiation heater 56, and an epitaxial gas was flowed from the gas inlet 53 provided at an upper end of the quartz verger 51 to its lower end, and exhausted from the gas outlet 54. Thereby, the epitaxial wafer as an embodiment example was manufactured.

Also, a conventional epitaxial wafer was manufactured, employing the conventional barrel type susceptor having inclination angle θd with values as shown in Table 1 in the same way as above.

TABLE 1

|  | Inclined angle of the susceptor (°) | | | |
| --- | --- | --- | --- | --- |
|  | θa | θb | θc | θd |
| Embodiment example | 2.9 | 1.9 | 0.9 |  |
| Conventional example |  |  |  | 1.9 |

Result (1): The result is shown in FIGS. 6 and 7.

Figure 6:
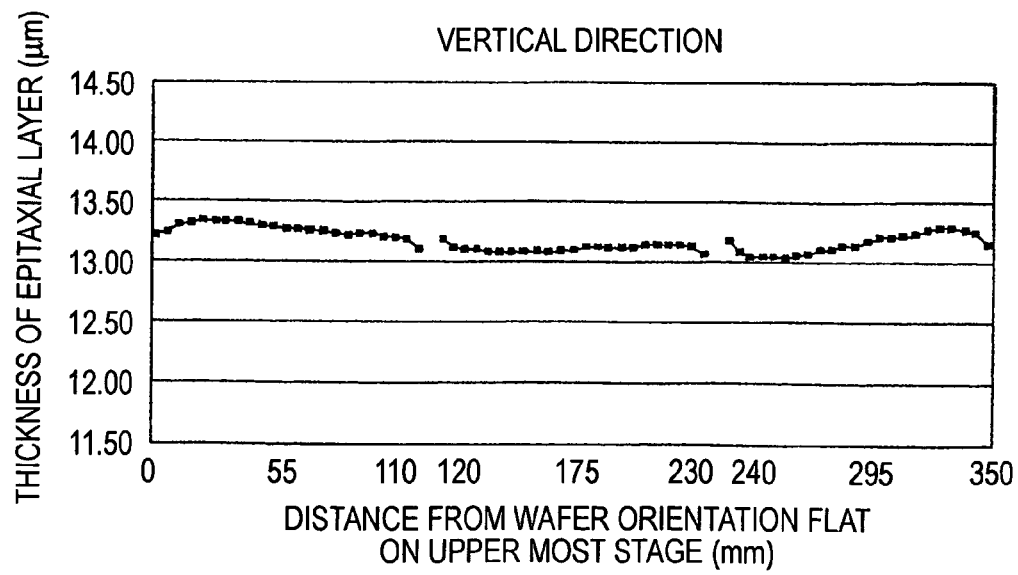
FIG. 6 is a chart showing the film thickness measurement results of an epitaxial test employing the barrel type susceptor according to the present invention.
Figure 7:
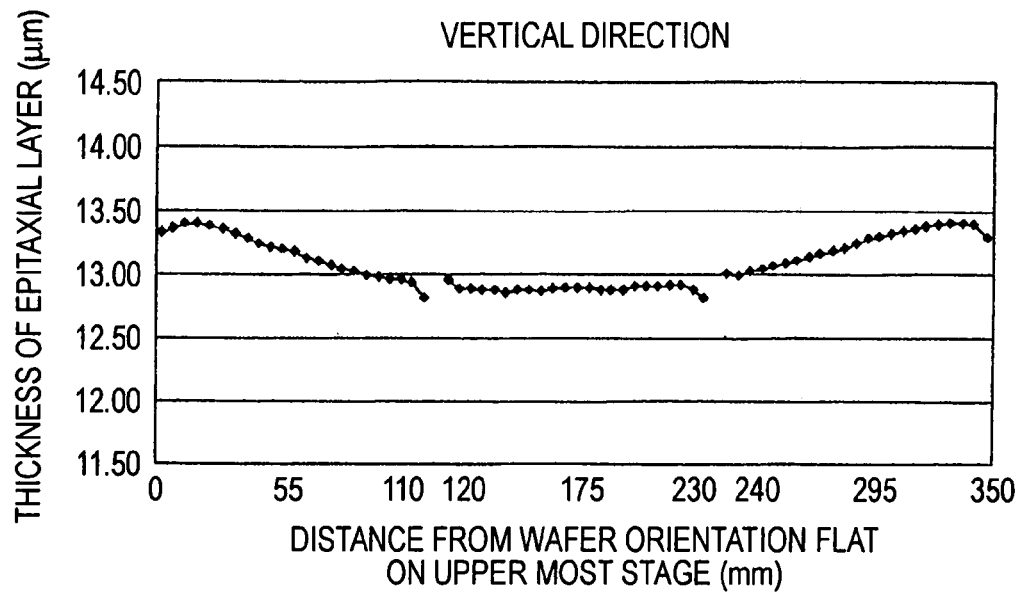
FIG. 7 is a chart showing the film thickness measurement results of an epitaxial test employing a conventional barrel type susceptor.
Figure 8:
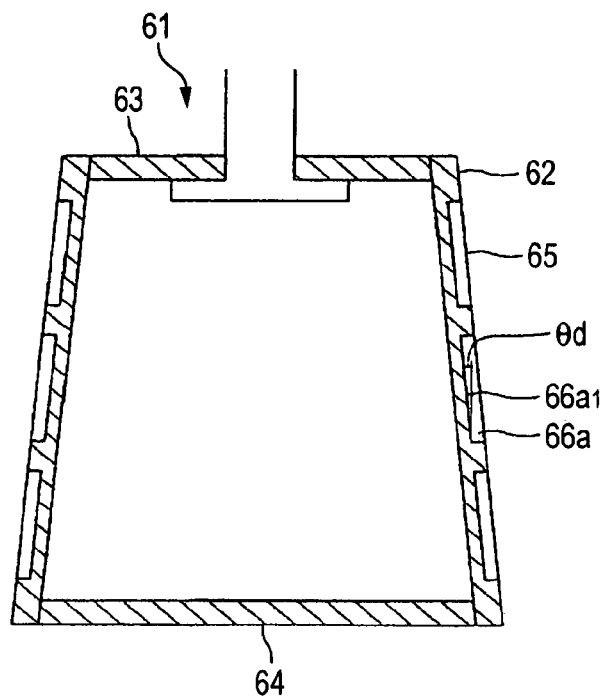
FIG. 8 is a perspective view of the conventional barrel type susceptor.
Figure 9:
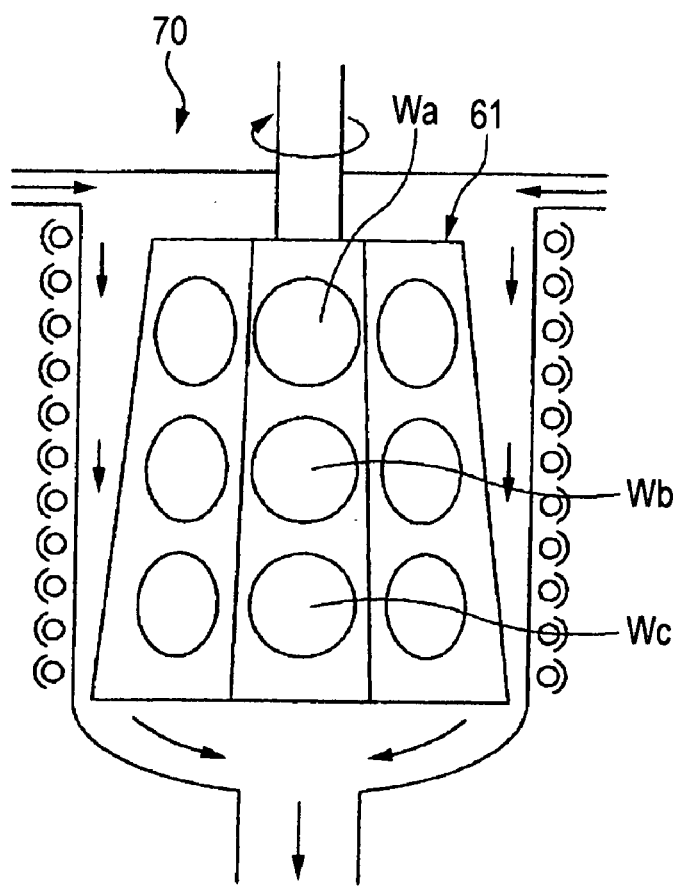
FIG. 9 is a conceptual view of an epitaxial apparatus employing the conventional barrel type susceptor.

It can be found that the uniform film thickness distribution is obtained within the wafer face and the batch in the embodiment example, as shown in FIG. 6.

On the contrary, in the conventional example, the film thickness is larger on the uppermost stage and the lowermost stage, and smaller on the middle stage. It could be found that the uniform film thickness distribution was not obtained within the wafer face and the batch, as shown in FIG. 7.

(2) The dispersion rate was calculated employing the film thickness value obtained from the above result (1) in accordance with a dispersion rate calculation expression as described below.

$$\text{Dispersion (\%)} = (\text{Max} - \text{Min}) / (\text{Max} + \text{Min}) \times 100 \quad \text{[Formula 1]}$$

Whereas the Max means maximum film thickness, and the Min means minimum film thickness.

TABLE 2

|  | Film thickness dispersion (%) | |
| --- | --- | --- |
|  | Inside wafer | Inside batch |
| Embodiment example | ±0.9 | ±2.0 |
| Conventional example | ±1.4 | ±3.0 |

As will be apparent from Table 2, in the embodiment example, the dispersion rate within the wafer is as small as ±0.9%, while in the conventional example, the dispersion rate is ±1.4%. The dispersion rate of the conventional example increased 55% over the embodiment example, that is, the wafer according to the conventional example is less uniform than the embodiment example. Also, in the embodiment example, the dispersion rate within the batch is ±2.0%, while in the conventional example the dispersion rate is ±3.0%, and increased 50% over the example, less uniform.

Therefore, according to the susceptor of present invention, it can achieve to provide a wafer having uniform thickness.

Note that an arrangement of the concaved portions on which the wafer is mounted can be changed in accordance with a required number of wafers, a temperature distribution in the verger, a flow rate distribution in the verger or the like.

While there has been described in connection with the preferred embodiments of the present invention, it will be obvious to those skilled in the art that various changes and modification may be made therein without departing from the present invention, and it is aimed, therefore, to cover in the appended claim all such changes and modifications as fall within the true spirit and scope of the present invention.

What is claimed is:

1. A barrel type susceptor used in a semiconductor epitaxial growth, the susceptor being a truncated shape, wherein the shape is that of a substantially pyramid or cone shape, the truncated shape of the susceptor comprising:
   a top plate;
   a bottom plate, an area of the bottom plate being larger than an area of the top plate; and
   a side plate which connects the top plate to the bottom plate,
   wherein the side plate is partitioned into at least two partition areas in a vertical direction of the susceptor,
   a concaved portion for mounting a wafer located in each partition area of the side plate, wherein each concaved portion comprises a bottom surface,
   each partition area of a side plate forms an inclined angle with a vertical plane passing through the susceptor and perpendicular to the top and bottom plates, wherein said angles are decreased gradually from the top plate to the bottom plate, and
   wherein each bottom surface of each concaved portion also forms an angle with said vertical plane, wherein said angles of the bottom surfaces are decreased gradually from the top plate to the bottom plate.

2. A barrel type susceptor as set forth in claim 1, wherein the susceptor is hollow and, wherein the shape of the susceptor is that of a substantially polygonal pyramidal shape.

3. A barrel type susceptor as set forth in claim 1, wherein the susceptor is hollow and, wherein the shape of the susceptor is that of a substantially cone shape.

4. A barrel type susceptor as set forth in claim 2, wherein the concaved portion of the susceptor is formed by combining flat plates.

5. A barrel type susceptor as set forth in claim 1, wherein the side plate is partitioned into three partition areas which comprise an upper side partition area having a first inclined angle $\theta a$, an intermediate partition area having a second inclined angle $\theta b$ and a lower side partition area having a third inclined angle $\theta c$.

6. A barrel type susceptor as set forth in claim 2, wherein the susceptor is formed by a cut out of a single material.

7. A barrel type susceptor as set forth in claim 2, wherein the shape is that of a substantially octagonal pyramidal shape.

8. A barrel type susceptor as set forth in claim 3, wherein the susceptor is formed by a cut out of a single material.

9. A barrel type susceptor as set forth in claim 5, wherein the inclined angles $\theta a$, $\theta b$ and $\theta c$ satisfy relations provided below:

$$0 < \theta b \leq 5°;$$

$$\theta b < \theta a < \theta b + 5°; \text{ and}$$

$$0 \leq \theta c < \theta b.$$

* * * * *